United States Patent
Daly et al.

Patent Number: 5,654,202
Date of Patent: Aug. 5, 1997

[54] STABILIZATION OF A PATTERNED PLANARIZING LAYER FOR SOLID STATE IMAGERS PRIOR TO COLOR FILTER PATTERN FORMATION

[75] Inventors: Robert Curtis Daly, Rochester; Jeffrey Carlyle Blood, Webster, both of N.Y.

[73] Assignee: Eastman Kodak Company, Rochester, N.Y.

[21] Appl. No.: 857,057

[22] Filed: Mar. 24, 1992

[51] Int. Cl.$^6$ ................................................ H01L 21/70
[52] U.S. Cl. .................................................. 438/70; 438/80
[58] Field of Search ............................ 437/3, 53, 225, 437/978, 2; 148/DIG. 43, DIG. 75

[56] References Cited

U.S. PATENT DOCUMENTS

| | | | |
|---|---|---|---|
| 2,548,564 | 4/1951 | Sprague et al. ............................ 95/8 |
| 2,548,575 | 4/1951 | Weyerts ............................ 101/149.1 |
| 2,675,316 | 4/1954 | Carroll et al. ............................ 95/8 |
| 2,713,305 | 7/1955 | Yutzy et al. ............................ 101/149.1 |
| 2,756,149 | 7/1956 | Saunders et al. ............................ 95/8 |
| 2,768,078 | 10/1956 | Reynolds et al. ............................ 95/7 |
| 3,448,706 | 6/1969 | Chisholm et al. ............................ 112/2 |
| 3,557,066 | 1/1971 | Cohen et al. ............................ 260/78.5 |
| 3,625,694 | 12/1971 | Cohen et al. ............................ 96/84 |
| 3,706,690 | 12/1972 | Duve et al. ............................ 252/359 E |
| 3,758,445 | 9/1973 | Cohen et al. ............................ 260/78 SC |
| 3,778,885 | 12/1973 | Stoll ............................ 29/527.2 |
| 3,898,088 | 8/1975 | Cohen et al. ............................ 96/84 A |
| 3,944,424 | 3/1976 | Cohen et al. ............................ 96/119 R |
| 4,966,831 | 10/1990 | Mehra et al. ............................ 430/321 |
| 5,028,547 | 7/1991 | Iizuka et al. . |
| 5,132,251 | 7/1992 | Kim et al. . |
| 5,143,855 | 9/1992 | Pace et al. . |

OTHER PUBLICATIONS

"Photoreactive Polymers: The Science and Technology of Resists", Arnost Reiser, John Wiley and Sons, Inc., N.Y. 1989, title page.

Kosar, "Light Sensitive Systems", pp. 323–324, John Wiley and Sons, N.Y., N.Y. (date unknown).

"Continuous Tone Dyed Diazo Imaging Elements," Research Disclosure, vol. 169, Item 16976, May 1978.

*Primary Examiner*—George Fourson
*Attorney, Agent, or Firm*—James D. Leimbach

[57] ABSTRACT

A solid state image sensor is described which includes a planarizing layer incorporated into a means of color separation. The planarizing layer has been found to provide a smooth, uniform surface for coating and adhesion of a color separator within the active device area. The planarizing layer remains on the completed device and is patterned to permit access to bonding pads. Negative photoresist materials, photoinitiated polymerization imaging systems and positive imaging systems may be selected for use as the planarizing layer.

10 Claims, 1 Drawing Sheet

STABILIZATION OF A PATTERNED PLANARIZING LAYER FOR SOLID STATE IMAGERS PRIOR TO COLOR FILTER PATTERN FORMATION

FIELD OF THE INVENTION

This invention relates to a method for the preparation of solid state image sensors and, more particularly, to solid state image sensors having planarized layers incorporated in a means of color separation.

BACKGROUND OF THE INVENTION

Solid state image sensors comprise a grid of laterally spaced sensor elements, each of which is called a "pixel". Each pixel in the sensor includes a photosensor such as a photodiode or a photocapacitor. In operation, light impinging upon an active silicon region in the pixel results in the generation of a charge. This charge, generated in each pixel, can be read and used to construct a digital image. Semiconductor arrays including sensor elements of this type are usually prepared by sequential patterning of conductors, semiconductors and insulators.

Silicon photosensors employed in these devices are sensitive to a wide bandwidth of radiation including the visible spectrum. However, such sensors are unable to separate the light into the several colored components used to reconstruct an image for printing, electrostatic imaging, thermal printing, silver halide imaging or video display. These technologies generally require several different color separated inputs, typically red, green and blue or cyan, magenta and yellow.

Heretofore, color separation has been achieved by constructing an array of dyed patterns which are to be placed upon the top of a sensor array. This array can be constructed externally and positioned atop the device or, alternatively, may be prepared directly upon a completed device wafer. This latter method for fabricating an integral color filter array (CFA) is a preferred approach for preparing high resolution devices because of the ease of accurately aligning the CFA to the pixels in the sensor array. CFA's employed for this purpose comprise layers of polymers which have been patterned and contain a dye. A typical pixel may be covered by a single polymer layer containing one or several dyes or by several layers of polymer, each of which contains one or more dyes. These dyed layers serve to remove light at certain wavelengths while permitting light at other wavelengths to reach the photosensor. Careful selection of dyes and an array pattern permits light at different wavelength to be sampled separately and the construction of a color separated image.

A preferred technique for the construction of an integral CFA involves coating and patterning a photosensitive polymer imaging system and, subsequently, dyeing the image. The coating, exposure and development of the photopolymer system are analogous to the operations performed using a photoresist for microlithography in the fabrication of devices. However, these images will be dyed and will remain in place as part of the finished device rather than being removed from the device. The image in this process may be dyed by placing the wafer in contact with a solution of dye or dyes which can migrate into the polymer image and be held or mordanted there. The rate of dye uptake and the amount of dye taken into the polymer are functions of the composition of the polymer and the dye, the process for making the image, and the solvents used to make the dye solution.

Still another method for the fabrication of a CFA involves using a photoresist having a dye therein prior to patterning. This obviates the necessity for dyeing solutions and processes. However, the viability of this technique is limited by the economics of using several different dyed resists and the distinct possibility of dye interference with resist exposure.

In both of the foregoing methods, the final intensity of the image is strongly dependent upon the thickness of the coating being dyed. Accordingly, at the saturation point, a thick coating absorbs more light whereas a thin coating will absorb less. Thus, the patterning process is repeated several times using different dye solutions or dyed resists.

Studies have revealed that a uniform pixel response is attainable only if the thickness of the dyed CFA coating is uniform throughout the device. This, of course, would not create any problems on a flat homogeneous surface. However, a completed device is not flat. The processing steps required to make the image sensor typically involve the patternwise definition of materials, either involving etching or deposition. Due to the patternwise definition of materials during the fabrication sequence, a finished wafer containing a plurality of integrated circuits or image sensors is no longer microscopically smooth and evidences topographical features of varying height or depth and of varying lateral dimension. These topographic features frequently evidence variations in vertical dimensions ranging from about 0.2 to 10 micrometers.

In the operation of the process for the preparation of such CFA coatings, a film is typically deposited by spin coating a solution or suspension on a wafer having topographic features of the type noted above. Under these circumstances, it is common for the film so deposited to exhibit thickness variations extending radially outward from the major topographic features which may be inherent in the device geometries or arise from test or alignment structures. These radially directed thickness variations are commonly referred to as radial streaks which are nothing more than a physical response to the effort to compel a thin layer of fluid to flow over a tall obstacle. When the wafer is subjected to spinning, the fluid is thrown outwardly from the center of the wafer and when it impinges on a topographic barrier which rises from the surface, the flow is disrupted and the coating solution preferentially goes around the feature rather than over it. This results in the formation of a shadow of thin coating behind the feature with thick edge beads on either side of the shadow. This combination of features is a streak.

A plurality of image sensor chips (called die) are simultaneously fabricated on a wafer. The die are positioned on the wafer so as to maximize the number of high quality chips produced. The die are separated by a grid commonly termed a street. The finished die are then separated into discrete chips by sawing or snipping the wafer along the streets. Since the street is considerably lower in height than the active area of the die, coating solutions tend to flow and pool in these areas rather than uniformly coating the entire wafer surface. Examination of a cross-section of the wafer reveals that there is an abrupt change in going from a street to the device surface. Accordingly, the active light collecting area of a pixel may range from 0.2 to 1.5 micrometers below the top of the device, while the street may range from 2 to 7 micrometers below the top of the device.

Studies have revealed that during the polymer coating process, streaks can be caused by any topographical feature. Prominent streaks have been observed at the inner corners of the die where the coating solutions tend to follow the street rather than climbing over the corner of the die. Streaks tend to point away from the center of the wafer and comprise a center film with thicker areas surrounding it. In light of the fact that the CFA remains on the finished device, any defects, such as streaks in the CFA, tend to adversely affect the quality of the sensor performance. Thus, photosensors under thick areas evidence less response to light and appear dark on pictorial output while thin areas allow light of other wavelengths to register and, therefore, appear too bright. The image of the streak then appears in the output image.

In order for a device chip to function in an electronic system, it must receive input and send output byway of connections to bonding pads. Accordingly, it is a constraint of the device and CFA fabrication that the metal bonding pads must be accessible for wire bonding, etc. when fabrication is completed. These open bonding pads contribute only slightly to the streaking phenomenon, but the processes for keeping the bonding pads open greatly increase the difficulties of both planarization and CFA fabrication.

Still another problem encountered with respect to thin CFA films arises when sharp topographic features are present during CFA fabrication. A coating which is forced to go over a sharp edge is both thinner than normal and under considerable stress. Subsequent swelling, during development or dyeing and shrinkage during baking, may result in cracking of the coating which exposes active regions near the crack to unfiltered light and creates particulate defects.

And lastly, another problem encountered in the construction of color filter arrays (CFA's) on a topographic wafer is that the thickness of the dyed coating varies across the width and length of each pixel. Dependent upon the topography of the finished sensor device, the coating at the center of the photoactive silicon area maybe either thicker or thinner than at the edge of the active area.

SUMMARY OF THE INVENTION

In accordance with the present invention, the foregoing prior art limitations are effectively obviated by means of a technique wherein a planarizing layer is coated directly upon a finished photosensor device wafer prior to the fabrication thereon of a color filter array. It has been determined that the planarizing layer so deposited facilitates the fabrication of the color filter array by providing a smooth, uniform surface for coating and adhesion within the active device area. Additionally, this surface permits the dyed layers of the CFA to be deposited with greater uniformity upon the active device area. An additional benefit achieved by the use of the described planarizing layer arises from the fact that it covers those areas of the wafer which are inactive, so resulting in the reduction of streaks that arise from non-uniform coatings. The planarizing layer is subsequently patterned to permit access to bonding pads. Since the planarizing layer remains on the finished device, it must be substantially defect free and transparent at wavelengths of light at which the device operates. A distinguishing feature of the planarizing layer described herein as compared with planarizing layers commonly employed in microlithographic technology occurs in that the former remains as part of the finished device and is not removed following pattern formation.

In the practice of the present invention, a technique is described for preparing a planarizing layer upon an image sensor device wafer which enhances the uniformity and quality of an integral color filter array constructed on the devices by partially filling the deep topographic features and concurrently reducing abrupt discontinuities that CFA coating solutions encounter in the active device area. The planarization layer partially fills the pixels in a normal conformal manner. As a result, the CFA coating deposited upon the planarizing layer has a much more uniform thickness across the active pixel area. Since the CFA coatings are not required to cross sharp topography, they do not routinely crack upon dyeing and drying. Although a truly flat surface is not achieved by the planarizing layer, the massive discontinuities, such as going from a street to the top of the device, have been reduced. Spin-on coating solutions are then able to make this ascent much more efficiently than they do with an unplanarized structure. Accordingly, a significant reduction of streaks in the CFA coatings is achieved in this manner together with the minimization of the intensity of any remaining streaks.

Viewed from one aspect, the present invention is directed to a method for the fabrication of an image sensor with a color filter array. The method first comprises the step of forming the image sensor with associated topographic features on a semiconductor body; forming a planarizing layer upon a surface of-the image sensor; and forming a color filter array on the planarizing layer.

Viewed from another aspect, the present invention is directed to a method for the fabrication of a plurality of image sensors having color filter arrays on a wafer. The method comprises a first step of forming a plurality of image sensors with associated topographic features on a wafer, each of the sensors having streets therebetween. The next step is forming a planarizing layer upon the surface of said image sensors and streets; and the next step is forming a color filter array on each of the sensors.

Viewed from still another aspect, the present invention is directed to an image sensor assembly. An image sensor assembly comprises a semiconductor body, a dielectric layer and a color filter array. The semiconductor body comprises an image sensor having an upper surface which is non-planar. The planarizing layer is on the upper surface of the image sensor and has an upper surface which is essentially planar. The color filter array is on the upper surface of the planarizing layer.

The present invention will be better understood by reference to the following detailed description taken in conjunction with the accompanying drawing and claims.

The drawings are not necessarily to scale.

DETAILED DESCRIPTION OF THE INVENTION

Figure 1:
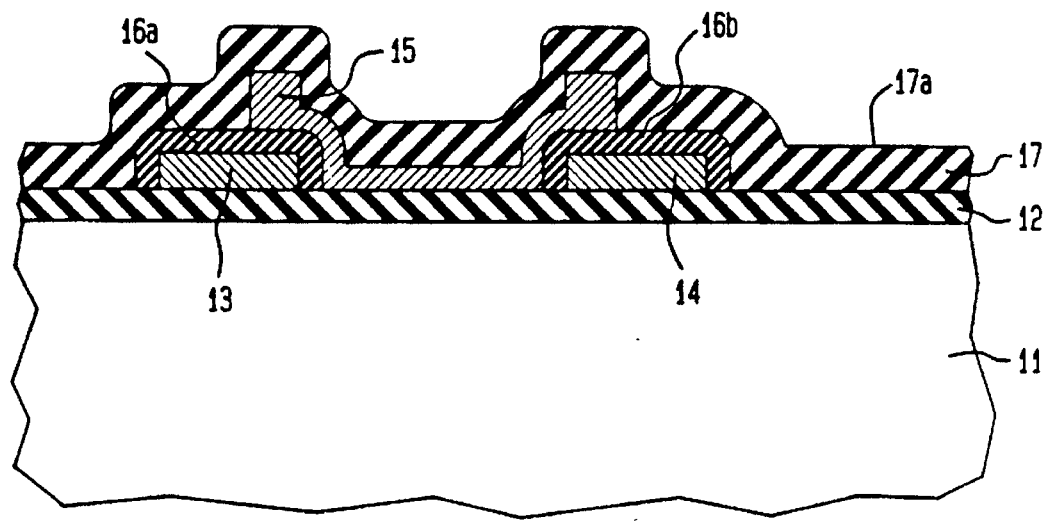
FIG. 1 a simplified cross sectional view of a portion of a prior art CCD image sensor.

Referring now to FIG. 1, there is shown a cross-sectional view of a prior art image sensor 10. Image sensor 10 comprises a silicon substrate (semiconductor body) 11 having deposited thereon a first dielectric layer 12 which is typically silicon dioxide $SiO_2$, gate electrodes 13, 14 and 15 which are typically doped polysilicon, a second dielectric layer having portions 16a and 16b which each are typically $SiO_2$, and a passivation layer 17 which is typically silicon dioxide $SiO_2$ or silicon nitride $Si_3N_4$. A top surface 17a of layer 17 is non-planar and follows the exposed contours of layer 12, layers 16a and 16b, and gate electrode 15. A color filter array layer (not shown) placed on surface 17a would not conform to the contours of surface 17a and thus would not function without introducing unwanted distortions.

Figure 2:
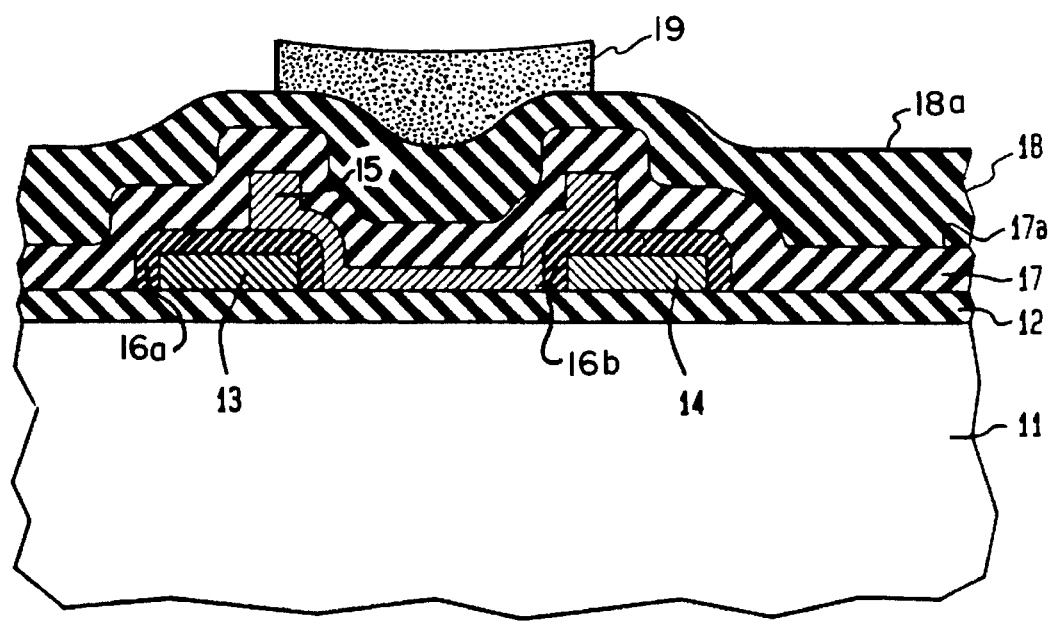
FIG. 2 is an image sensor assembly in accordance with the present invention.

Referring now to FIG. 2, there is shown an image sensor assembly 20 in accordance with the present invention. Image sensor assembly 20 comprises the structure of the image sensor 10 of FIG. 1 and in addition comprises a planarization layer 18 on surface 17a of layer 17, and a color filter array layer 19 covering a partially planar surface 18a of layer 18.

The image sensor assembly 20 is typically fabricated as follows: The image sensor 10 of FIG. 1 is typically formed as a plurality of essentially identical image sensors formed on a semiconductor body of a wafer in accordance with conventional semiconductor device fabrication technology. The passivation layer 17 is normally patterned to permit access to the bonding pads of the device. However, it may be advantageous to leave it unpatterned to enhance the planarity of the wafer surface during color filter array (CFA) (not shown) fabrication. Under these circumstances, an etch mask for the passivation layer is used to subsequently expose the bonding pads, the etch mask comprising a planarizing layer which is described in a subsequent step in the practice of the invention.

Next, the resultant structure is washed, as for example with a solution of chromium trioxide in sulfuric acid, and rinsed thoroughly with deionized water. Then, the washed structure is baked for purposes of dehydration prior to planarization.

Following, a coating solution comprising a planarization material is deposited by spin coating on the structure to obtain a desired coating thickness. Specific thickness of the coating is dictated by considerations relating to the height of the topographic features on the wafer. Solvent present in the coating may then be removed by baking, thereby resulting in enhanced adhesion and maximization of the planarity of the surface. An optimum thickness has been found to correspond with a range of 0.3 to 5 micrometers. The planarization layer 18 so deposited is then subjected to imagewise exposure and development, thereby resulting in a planarization layer on the sensor, streets and adjacent features such as alignment targets and test structures (all not shown). The planarization layer 18 may then be removed from bonding pads (not shown).

Various options exist for completion of the planarization layer. More specifically, the materials chosen for use as the planarization layer 18 and the process employed for opening the device bonding pads for connection to external electronic circuitry (not shown) dictates the procedure to follow. Thus, for example, it may be advantageous to generate openings down to the bonding pads, particularly if the planarizing layer is a photosensitive composition or if a photoresist is coated upon the planarizing layer. Materials useful in the former include formulations capable of photoinitiated polymerization, photocrosslinking, photodimerization, light induced scission and photofunctional change. In each case, the patternwise exposure of the coating creates differences in the dissolution properties of the coating. Many well known polymers and formulations may be used as photoresists for this purpose and they may be used directly as a planarizing layer or upon the planarizing layer. Further information may be found by reference to "Photoreactive Polymers: The Science and Technology of Resists". Arnost Reiser, John Wiley and Sons, Inc., N.Y. 1989.

In a planarizing layer which functions as a negative photosensitive material, the exposed areas become less soluble in developer. Masked exposure permits all of the wafer except the coating above the bonding pads to be exposed to light. As a result, the exposed areas become less soluble in the developer. Development then removes the coating from atop the bonding pads, thereby permitting connection to an external electrical circuit. Chemical functionalities which may serve as the photosensitive element for resists of this type include the azide and diazonium compounds. The azides decompose upon exposure to form nitrenes which are highly reactive with a variety of organic molecules. Imaging systems which are useful as planarizing layers can be formulated from either mono or bisazides which absorb at the exposure wavelength and are within a polymer matrix such as novolac, cyclized polyisoprene or polyhydroxystyrene which have sites that are reactive with nitrenes. Multiple insertion, abstraction and addition reactions of the nitrenes on the polymer chain result in crosslinking of the exposed area. In light of the fact that a crosslinked area cannot dissolve, a negative image is formed by treating the exposed wafer with a solvent for the original coating. Imaging with a diazonium salt or a diazo resin occurs by altering the solubility of the exposed areas without effecting crosslinking. The coating solution for this type of planarizing layer includes an organic diazonium salt and a water soluble polymer in water. Polymers suitable for this purpose include gelatin, polyvinyl alcohol, polymers containing quaternary ammonium salts and poly(vinyl pyrrolidone). Upon exposure at an appropriate wavelength, the diazonium salt eliminates nitrogen and becomes non-ionic and, therefore, insoluble in water. This photofunctional change acts to inhibit the dissolution of the exposed areas and results in a negative image after development with some crosslinking occurring.

Polymers, such as poly(vinyl cinnamate), which contain photodimerizable chromophores provide another useful class of negative imaging planarizing layers suitable for use in the practice of the present invention. In such cases, the reactive chromophore must contain a group which can dimerize by a 2+2 photocyclization. Representative groups include cinnamate, styrylacrylate, napthylacrylate and thiofurylacrylate. These polymers are typically prepared by reacting poly(vinyl alcohol) with the corresponding acid chloride. Useful polymers may also be prepared for this purpose by modification of polystyrene or poly (chloromethylstyrene) with an acid chloride or an amine bearing chromophores. Dimerization may then be effected by direct exposure or by sensitization with either triplet or electron transfer sensitizers.

Still another class of materials suitable for use as a planarization layer are the photoinitiated polymerization imaging systems. In such systems, light is absorbed by a compound which breaks down to form a reactive species which initiates the polymerization of monomers. These initiators are typically chosen to produce either a free radical or a cation. The free radical rapidly polymerizes acrylates and methacrylates to yield a high polymer. Since the monomer dissolves in many more solvents than the polymer and does so rapidly, a negative image mask is obtained after exposure and development. Cationic polymerization of epoxides yield the same results. Suitable free radical photoinitiators for this purpose include peroxides, azo compounds, benzoin ethers and ketocoumarins with amino accelerators. Photoresponsive cationic initiators include diazonium, iodinium and sulfonium salts. The optimum results are obtained with multifunctional monomers. Since the monomer serves as a coating solvent and is polymerized rather than removed, this system yields a more planar system.

Positive imagable systems, which become more soluble in the developer upon exposure, may also be used as the planarizing layer. These systems function in accordance with one of two mechanisms, namely, photofunctional change or scissioning. Thus, for example, poly(methyl methacrylate) is a polymer which undergoes scissioning during exposure at an appropriate wavelength. In this process, the polymer backbone is broken, so reducing the molecular weight of the polymer. Since the dissolution rate for a polymer composition varies significantly and inversely with the molecular weight of the polymer, the rate of dissolution increases as the molecular weight decreases. Accordingly, during the development sequence, the exposed areas are removed rapidly to yield a positive image. Other scissioning polymers include poly (methylisopropenylketone), poly(dimethylglutarimide) and poly(nonafluorobutyl-methacrylate).

Photofunctional change resists based upon a naphthalenequinone diazide compound produces positive images after exposure and development without changing the molecular weight of the polymer. Resists of this type include two principle components, a photoactive compound and a binder polymer which is soluble in an aqueous base. The naphthalenequinone diazide photoactive compound inhibits the dissolution of the polymer binder in an aqueous base. Upon exposure to light, the quinone is destroyed and the photoproduct becomes a dissolution accelerator for the binder in an aqueous base. The result of this exposure followed by development again leads to a positive image. Binders useful for this type of imagable planarizing layer include novolac resins and polyhydroxystyrene.

In the event it does not appear desirable to pattern the planarizing layer directly, it may be coated with a compatible and conventional photoresist. Pattern transfer may then be attained by exposure and development of the resist followed by etching the unprotected planarizing layer images. As employed herein, the term "compatible" is defined as meaning that the resist coating and development do not interfere with the planarizing layer and that etching of the planarizing layer does not destroy the image in the resist and that the resist layer can be removed from the planarizing layer after completion of pattern transfer. Dependent upon the composition of the planarizing layer and the method selected for etching, useful resists may include naphthalenequinone diazide with either poly (hydroxy styrene) or novolac and resists which incorporate silicon into the images for enhanced oxygen reactive ion etching resistance. If the planarizing layer selected is not required to be a photoresist itself, a variety of soluble polymers are suitable for use as planarizing layers without regard to their photoresponsive behavior. Useful polymers for this purpose include polystyrenes, acrylate and methacrylate polymers, polyimides, polyesters and polyurethanes.

The planarizing layer, whether patterned or unpatterned, may require stabilization in the CFA fabrication process. It is necessary that the planarization layer not swell and distort or absorb dye during the coating and dyeing steps which are an integral part of the CFA fabrication. Typically, stabilization is effected by hardening or crosslinking the surface of the planarization layer by baking, with a crosslinking exposure by treatment with a plasma or with a combination of these treatments. In the case of negative imagable planarization layers which are crosslinked, baking alone may be adequate to form a tight stable network. Treatment with a non-oxygen plasma alters the chemistry of the surface while concurrently bathing the wafer in high intensity deep ultraviolet light. In each case, the process yields a planarizing layer which does not swell with solvent and which does not absorb dye.

With the planarizing layer in place, color filter array (CFA) fabrication is then begun by coating, patterning and dyeing the first color separation layer. Additional layers, typically two (2) or more, are then coated, patterned and dyed to produce the completed color filter array.

The dye containing filter layers described herein can take varied forms, depending upon the materials selected and procedures chosen for their preparation. In a preferred fabrication sequence, photopatterned filter layers are first formed by coating uniform layers, imagewise exposure, washing off unexposed layer portions and then dyeing the remaining filter layer by dye imbibition.

A typical procedure for fabricating a CFA is as follows:

A photopatterned filter layer 19 is constructed by applying a solution of a photoinsolubilizable material to the planar support surface. The support is then spun, creating centrifugal forces which spread the coating solution over the surface of the wafer and fling the excess solution off the edge of the wafer. Thereafter, the residual solvent, typically water, is removed by drying the layer either at ambient or elevated temperatures. The resulting solid layer is then given a patterned exposure to actinic radiation typically ultraviolet radiation, to define the desired pattern. Following exposure, the latent image layer so formed is brought into contact with a developer which selectively washes off the layer in unexposed areas. The support bearing the layer is typically immersed in the developer or spun or jogged while developer is being applied to insure uniform developer contact.

After the patterned filter layer 19 is formed, dye is imbibed therein by contacting it with a dye solution. As the dye enters the layer by imbibition, the absorbance of the filter layer increases in optical density in direct relation to the amount of dye imbibed. As saturation of the filter layer by the dye is approached, the rates of additional dye imbibition and therefore a further increase in the optical density of the filter layer progressively decline. It is preferred to saturate the filter layer 19 with the dye, where "saturation" is defined as a dye concentration which produces an optical density that is increased by less than 5 percent when the duration of dye imbibition is doubled. In the event a layer is dyed to saturation, the amount of dye imbibed is determined primarily by the filter layer thickness.

Subsequent filter layers can be formed by the same sequence of steps, differing only in the pattern or its location and the dye imbibed.

In a simple approach to forming filter layers by a photopatterning, dye imbibition process, hydrophilic colloids can be suspended in water along with a radiation responsive hardening (i.e.,crosslinking) agent. These aqueous solutions can then be coated to form photopatternable filter layers. Suitable hydrophillic colloids for this purpose include substances such as proteins, protein derivatives, cellulose derivatives and ploysaccharides such as cellulose esters, gelatin (alkali or acid treated), gelatin derivatives such as acetylated gelatin and phthalated gelatin, dextren, gum arabic, zein, casein, pectin, collagen derivatives, collodion, agar-agar, arrowroot and albumin, all generally known to be useful as binders in photographic elements.

The hydrophillic colloid, preferably gelatin or a gelatin derivative, can be conveniently employed in combination with a dichromate salt, employed as a radiation responsive hardening agent. The dichromate salt is, for example, potassium, sodium or ammonium dichromate. Dichromated gelatin has sufficient resolution for the filter elements of the color filter arrays for solid state imaging devices. It adheres well and is conveniently coated and developed using water solutions. Gelatin and related hydrophillic colloids are known to exhibit some capacity for mordanting cationic dyes. Thus, relatively simple filter layer constructions are possible. It is, of course, recognized that conventional mordants can, if desired, be employed in combination.

For the most precise filter layer boundary definitions, it is preferred to employ photoinsolubilizable polymers, commonly referred to as negative working photoresists. Further, to enhance dye immobilization within the filter layers, it is specifically preferred to incorporate a mordant within the photoresist coating composition.

With regard to the planarization layer 18, the diazo resins are a preferred photoresponsive polymer useful for this purpose. Many water soluble radiation sensitive diazo resins are useful in this application. Preferred materials are the low molecular weight diazo resins which are acid condensation products of a diazonium salt of p-aminodiphenylamine, such as diphenylamine-4-diazonium halide or diphenylamine-4-diazoniumphosphate, condensed in acid with aldehydes such as paraformaldehyde or formaldehyde and converted to a double metal salt, such as chlorozincate or fluoroborate. These resins are well known in the art and are described, for example by Kosar, "Light Sensitive Systems", pp. 323–324, John Wiley and Sons, N.Y., N.Y. One particularly suitable diazo resin composition is the composition described in "Continuous Tone Dyed Diazo Imaging Elements," Research Disclosure, Volume 169, Item 16976, May 1978.

The diazo resin is mixed with a mordant to produce a photopatternable coating composition employed to form the filter layers. A variety of mordants are known which are entirely compatible with the formation of a photopatterned layer by the diazo resin. Cationic mordants capable of immobilizing anionic dyes, are particularly preferred. Useful mordants can be selected from among those disclosed in U.S. Pat. No. 2,548,564 (Sprague et al.), U.S. Pat. No. 2,548,575 (Weyerts), U.S. Pat. No. 2,675,316 (Carroll et al.), U.S. Pat. No. 2,713,305 (Yutzy et al.), U.S. Pat. No. 2,756,149 (Saunders et al.), U.S. Pat. No. 2,768,078 (Reynolds et al.), U.S. Pat. No. 3,448,706, (Chisholm et al) U.S. Pat. No. 3,557,066, (Cohen et al) U.S. Pat. No. 3,625,694, (Cohen et al) 3706,690, (Dveve et al) U.S. Pat. No. 3,758,445 Cohen et al) U.S. Pat. No. 3,778,885 Stoll), 3,898,088 and U.S. Pat. No. 3,944,424, Cohen et al.).

Particularly preferred mordants are vinylbenzyl quaternary ammonium polymeric mordants which comprise a repeating unit which conforms to the structure:

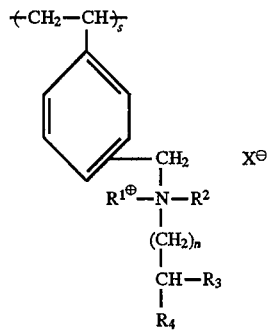

wherein:

$R^1$ and $R^2$ are the same or different and are aryl, aralkyl or alkaryl having from 6 to about 20 carbon atoms or an alkyl group having from 1 to about 10 carbon atoms;

$R^3$ and $R^4$ are either both hydrogen or, together with the carbon atom to which they are attached, form a saturated, unsaturated or aromatic ring or ring system containing from 5 to 10 carbon atoms such as cyclohexyl, cyclopentyl, phenyl, and naphthyl;

X is an anion, such as halide, e.g., chloride, methanesulfate, or p-toluene sulfonate; and n is 0, 1 or 2.

Where the mordant is a copolymer, the remainder of the polymeric mordant is not critical. Many ethylenically unsaturated monomers can be copolymerized with the vinylbenzene quaternary ammonium monomers to produce satisfactory mordants. Vinyl benzenes, e.g., styrene are preferred ethyleneically unsaturated monomers for incorporation in the mordant copolymers. Chloromethyl styrene may be directly copolymerized and subsequently quaternized. The quaternary ammonium-containing repeating units usually comprise between 10 and 100, preferably 40 to 100 mole percent of the polymeric mordant.

Corresponding anionic mordants can be prepared by substituting for the vinylbenzene quaternary ammonium repeating units anionic repeating units derived from carboxylic acid substituted vinyl monomers, such as acrylic acid, methacrylic acid, alpha-chloroacrylic acid or 1-propene-1,2,3-tricarboxylic acid.

The relative amounts of mordant and diazo resin depend on the molecular weight and the mordanting strength of the mordant, the particular dyes to be used to make the color filter elements of the color filter array and other factors. A preferred range of diazo resin is from about 0.16 to about 1.0 mg/dm$^2$ of coating, and a preferred range of mordant is from about 0.5 to about 5.0 mg/dm$^2$, most preferably from about 1.0 to 1.5 mg/dm$^2$. In making color filter arrays or solid state imaging devices, it is most common to coat by spin coating; however, other methods are useful. The resins are sensitive primarily to ultraviolet (UV) light and are usually processed using water such as by spraying or by immersing the layer in an agitated vessel.

Polymers which contain both a photocrosslinkable unit and a mordant unit are also useful for color filter array fabrication. Suitable coploymers for this purpose are those disclosed in U.S. Pat. No. 4,808,510 (Snow et al.) which have the general formula:

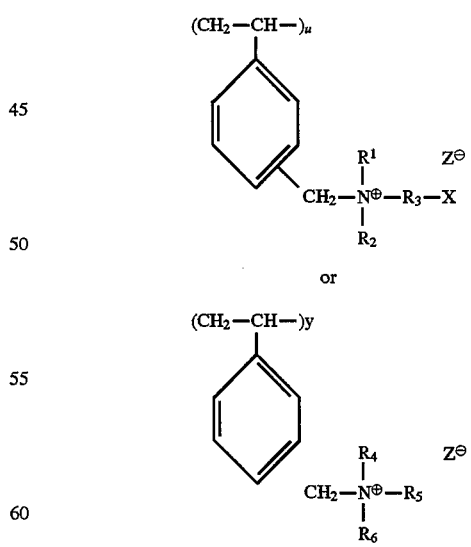

wherein:

$R_1$ and $R_2$ are lower alkyl groups $R_3$ is a divalent linking group $R_4$, $R_5$ and $R_6$ are hydrocarbon groups containing 1–16 carbon atoms X is a crosslinking group, Z is a counter ion, and u and y are designations of the polymeric character of the compound and may be used together to define the amount of crosslinking monomer (u+y=100%).

It is to be understood that the embodiments described herein are illustrative of the general principles of the invention. Modifications may be readily devised by those skilled in the art without departing from the spirit and scope of the invention. Thus, for example, if access to the bonding pads is not opened prior to color filter array fabrication, access must be opened following completion of the fabrication sequence. This end may be attained by coating a conventional photoresist over the wafer with the color filter array in place and then patterning the photoresist. Neither the coating nor the development process is permitted to interfere with the active device areas in this process. The planarizing layer and/or passivation layer may then be removed by selective etching. Finally, this final resist may be removed if it absorbs light at visible wavelengths or it may be left in place as a final protection for the color filter array if it is substantially clear in the visible region. Furthermore, if the bonding pads are to be opened by this process, the materials used for the planarizing layer would not have to be photosensitive. Useful polymers for this purpose include the polystyrenes, acrylate and methacrylate polymers, polyimides, polyesters and polyurethanes.

What is claimed is:

1. A method for fabrication of permanent three-color color filter arrays on each of a plurality of image sensors on a semiconductor body, comprising the steps of:

forming on one surface of a semiconductor body a plurality of image sensors with first topographic features, bond pads with second topographic features associated with each one of said plurality of image sensors, and streets with third topographic features separating each one of said plurality of image sensors and associated bond pads;

applying a patternable planarizing layer to partially planarize said first and second and third topographic features;

patterning the planarizing layer by patternwise activating exposure and pattern development so that the planarizing layer is removed from said bond pads but remains on said image sensors and said streets;

stabilizing the patterned planarizing layer to render it inert to the conditions encountered in subsequent color filter array fabrication steps;

deposing a color filter pattern of a first color on the partially planarized first topographic features of each one of said image sensors; and repeating said color filter pattern deposing step once with a second color and once more with a third color to obtain a permanent three-color color filter array on each one of said image sensors.

2. The method of claim 1, wherein said applying step comprises:

coating by a spin-coat technique a negative photoresist formulation to achieve partial planarization of said topographic features.

3. The method of claim 2, wherein said negative photoresist formulation comprises an aqueous coatable formulation containing both an exposure-activatable crosslinking functionality and a mordant functionality.

4. The method of claim 2, wherein said negative photoresist formulation comprises an aqueous coatable formulation containing an admixture of an exposure-activatable diazo resin and a quarternary ammonium mordant polymer.

5. The method of claim 2 wherein said negative photoresist formulation comprises a coatable formulation containing a functionality capable of exposure-activatable photo dimerization and a quarternary ammonium mordant polymer.

6. The method of claim 1 wherein said applying step comprises:

coating by a spin-coat technique a positive photoresist formulation to achieve partial planarization of said topographic features.

7. The method of claim 6 wherein said positive photoresist formulation comprises a coatable formulation containing a novolac resin binder and an exposure-activatable naphthalene quinone diazide compound.

8. The method of claim 6 wherein said positive photoresist formulation comprises a coatable formulation containing exposure-activatable poly-dimethylglutarimide polymer.

9. The method of claim 6 wherein said positive photoresist formulation comprises a coatable formulation containing exposure-activatable poly-dimethylghtarimide polymer.

10. The method of claim 1 wherein said stabilizing step comprises:

subjecting the patterned planarizing layer to one of light or heat or plasma or combinations thereof.

* * * * *